United States Patent [19]
Farrar et al.

[11] Patent Number: 5,980,657
[45] Date of Patent: Nov. 9, 1999

[54] ALLOY FOR ENHANCED FILLING OF HIGH ASPECT RATIO DUAL DAMASCENE STRUCTURES

[75] Inventors: Paul A. Farrar, So. Burlington, Vt.; John H. Givens, Meridian, Id.

[73] Assignee: Micron Technology, Inc., Boise, Id.

[21] Appl. No.: 09/037,935

[22] Filed: Mar. 10, 1998

[51] Int. Cl.$^6$ ................................ C22C 21/12

[52] U.S. Cl. ............... 148/438; 148/439; 420/537; 420/534; 257/765

[58] Field of Search .................. 148/438, 439; 420/537, 534; 257/765

[56] References Cited

U.S. PATENT DOCUMENTS

| | | | |
|---|---|---|---|
| 3,561,954 | 2/1971 | Brook | 148/159 |
| 4,595,429 | 6/1986 | Le Caer et al. | 148/403 |
| 5,205,770 | 4/1993 | Lowrey et al. | 445/24 |
| 5,229,316 | 7/1993 | Lee et al. | 437/67 |
| 5,300,155 | 4/1994 | Sandhu et al. | 148/33 |
| 5,395,801 | 3/1995 | Doan et al. | 437/225 |
| 5,409,563 | 4/1995 | Cathey | 156/643 |
| 5,416,045 | 5/1995 | Kauffman et al. | 437/174 |
| 5,497,017 | 3/1996 | Gonzales | 257/306 |
| 5,641,545 | 6/1997 | Sandhu | 427/573 |
| 5,644,166 | 7/1997 | Honeycutt et al. | 257/754 |

FOREIGN PATENT DOCUMENTS

| | | |
|---|---|---|
| 60-187654 | 9/1985 | Japan . |
| 61-159545 | 7/1986 | Japan . |
| 63-179041 | 7/1988 | Japan . |
| 1211563 | 11/1970 | United Kingdom . |

OTHER PUBLICATIONS

Zolotorevskii, V.S.; Istomin—Kastrovskii, V.V.; Postnikov, N.S.; Bakirov, Zh.T.; Belokopytova, E.S., Effect of magnesium +germanium and magnesium+silicon additives on mechanical properties and structure of cast aluminum—copper alloys, IZV. Vyssh. Uchebn. Zaved., Tsvetn. Metall, (1983), (5), 100—4, abstract only AN. 100 : 72561 HCA.

Kaanta, C., et al., "Dual Damascene: A ULSI Wiring Technology", *VMIC Conference*, 144–152, (Jun. 1991).

Licata, T., et al., "Dual Damascene AL Wiring for 256M DRAM", *VMIC Conference*, 596–602, (Jun. 1995).

*Primary Examiner*—Sikyin Ip
*Attorney, Agent, or Firm*—Schwegman, Lundberg, Woessner & Kluth P.A.

[57] ABSTRACT

An integrated circuit alloy is described which reduces the alloy melting temperature for improved coverage of high aspect ratio features with a reduced deposition pressure. The alloy is used to fabricate metal contacts and interconnects in integrated circuits, such as memory devices. The contacts and interconnects can be high aspect ratio features formed using a dual damascene process. An aluminum interconnect alloy is described for use in an integrated circuit which includes Al, Cu, Si. Ge and Mg can also be provided in the alloy. The composition of Si+Ge+Mg provides a melting temperature of the aluminum interconnect alloy which is between 500 and 550° C.

10 Claims, 2 Drawing Sheets

ALLOY FOR ENHANCED FILLING OF HIGH ASPECT RATIO DUAL DAMASCENE STRUCTURES

TECHNICAL FIELD

The present invention relates generally to integrated circuits and in particular, the present invention relates to an alloy for enhanced filling of dual damascene structures.

BACKGROUND OF THE INVENTION

As the density of semiconductor devices continues to increase, the need for smaller interconnections also increases. Historically, the semiconductor industry has used a subtractive etching process to pattern metal interconnect layers of the semiconductor. This metal processing technique, however, has limitations including poor step coverage, non-planarity, shorts and other fabrication problems. To address these problems, a dual damascene technique has been developed. This process, as explained in "Dual Damascene: A ULSI Wiring Technology", Kaanta et al., 1991 *VMIC Conference,* 144–150 (Jun. 11–12, 1991) and incorporated herein by reference, involves the deposition of a metal into contact vias and conductor trenches which are patterned in the semiconductor. The semiconductor is then subjected to a known CMP (chemical-mechanical polish) process to both planarize the semiconductor and to remove excess metal from all but the patterned areas.

The metal layer can be fabricated using known CVD (chemical vapor deposition) or PVD (physical vapor deposition) techniques. Filling the patterned structures formed during the dual damascene technique, however, has proved difficult. This difficulty is enhanced as the aspect ratio (depth to width) of the patterns increase. As such, the use of high pressure to achieve improved fill in sub-micron conductor processing for ULSI integrated circuits has received considerable attention recently. One of the problems encountered is that high temperatures must be combined with high pressure to achieve conditions where sufficient metal flow will take place to fill the narrow troughs in the damascene process.

During the metal deposition process, an aluminum alloy which may contain such elements as copper and silicon, is deposited on the integrated circuit wafer. Aluminum has been typically used due to its low resistance and good adhesion to $SiO_2$ and Si. Silicon is usually added as an alloying element to alleviate junction spiking in Al contacts to Si. Further, electromigration and hillocks (spike-like formations) can be reduced by adding Cu, Ti, Pd or Si to aluminum to form alloys. These alloying elements precipitate at the grain boundaries. Thus, the grain boundaries are "plugged" and vacancy migration is inhibited.

For the reasons stated above, and for other reasons stated below which will become apparent to those skilled in the art upon reading and understanding the present specification, there is a need in the art for an alloy which can be used to fill high aspect ration structures in an integrated circuit without requiring high temperatures or pressures. Specifically, an alloy and alloy system is needed which will enable force fill to be achieved at lower temperatures and/or lower pressures than can be obtained with the standard Al-0.5% Cu alloy which is used by much of the industry.

SUMMARY OF THE INVENTION

The above-mentioned problems with metal interconnect alloys in an integrated circuit and other problems are addressed by the present invention, and which will be understood by reading and studying the following specification. An interconnect alloy is described which reduces temperature and pressure needed to fabricate high aspect ratio features.

In particular, the present invention describes an aluminum interconnect alloy for use in an integrated circuit. The alloy comprises aluminum, 3 to 6 wt percent copper and 0.25 to 1.5 wt percent silicon. Up to 1 wt percent Ge and up to 2 wt percent Mg can also be included in the alloy. The composition of Si+Ge+Mg provides a melting temperature (solidus) of the aluminum interconnect alloy which is between 500 and 550° C.

In another embodiment, an aluminum interconnect alloy for use in an integrated circuit is provided which consists of aluminum, 4.5 to 5.5 wt percent copper, 1 to 1.5 wt percent silicon, up to 1 wt percent Ge, and up to 2 wt percent Mg. The composition of Si+Ge+Mg provides a melting temperature (solidus) of the aluminum interconnect alloy which is between 500 and 550° C.

In yet another embodiment, an aluminum interconnect alloy for use in an integrated circuit the alloy consists of aluminum, 4.9 wt percent copper, 1.1 wt percent silicon, up to 1 wt percent Ge, and up to 2 wt percent Mg. The composition of Si+Ge+Mg provides a melting temperature (solidus) of the aluminum interconnect alloy which is between 500 and 550° C.

A method of fabricating an integrated circuit is described. The method comprises the steps of forming contact vias and interconnect trenches in a dielectric layer of the integrated circuit, depositing a metal alloy in the contact vias and interconnect trenches, and polishing the integrated circuit to remove excess metal alloy and provide defined interconnect lines. The alloy comprises aluminum, 4.5 to 5.5 wt percent copper and 1 to 1.5 wt percent silicon.

An integrated circuit memory device is also provided which comprises an array of memory cells, internal circuitry, and metal contacts and interconnects coupled to the memory array and internal circuitry. The metal contacts and interconnects which consist of aluminum, 4.5 to 5.5 wt percent copper and 1 to 1.5 wt percent silicon.

DETAILED DESCRIPTION OF THE INVENTION

Figure 1A:
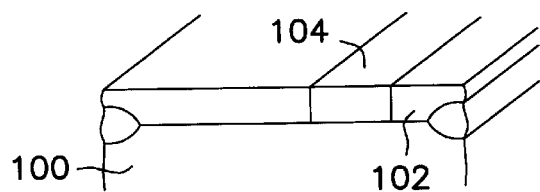
FIG. 1A illustrates a cross-section of an integrated circuit fabricated using a dual damascene fabrication technique according to the present invention.
Figure 1B:
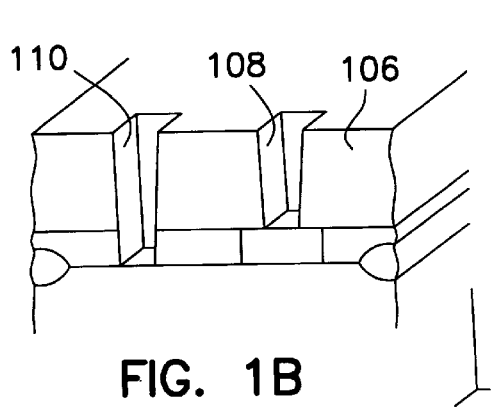
FIG. 1B further illustrates the integrated circuit of FIG. 1A.
Figure 1D:
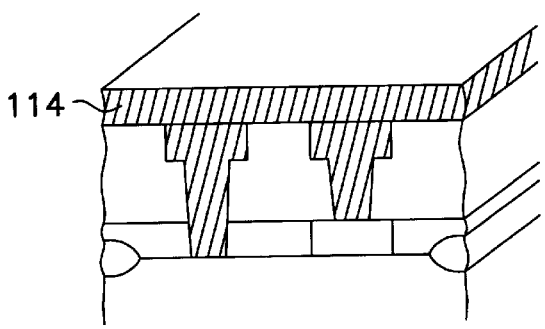
FIG. 1D further illustrates the integrated circuit of FIGS. 1A–1C.
Figure 1C:
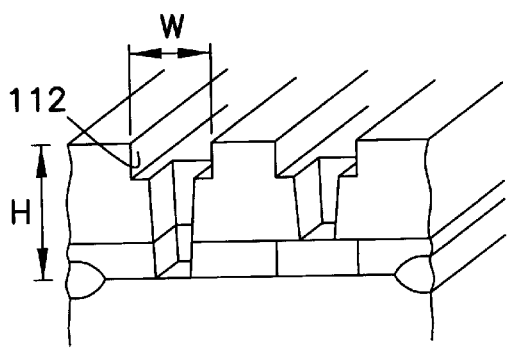
FIG. 1C further illustrates the integrated circuit of FIGS. 1A–1B.
Figure 1E:
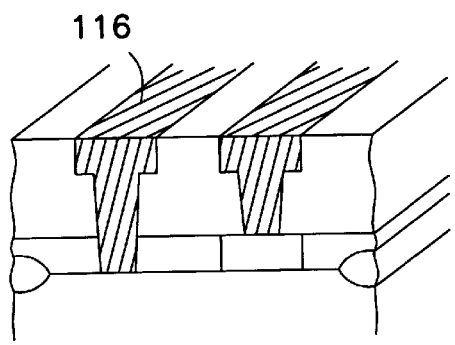
FIG. 1E further illustrates the integrated circuit of FIGS. 1A–1D.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

Prior to describing the metal alloy of the present invention, a description of the fabrication of metal conductor and contacts using a dual damascene process is provided. Referring to FIGS. 1A–E, a semiconductor base layer 100 is fabricated with an insulator layer 102, such as an oxide layer. The base layer is typically silicon having regions which are either p-type or n-type doped. A conductive area 104 is provided above the base layer. This conductive region can be any type of conductor or semiconductor, such as polysilicon, metal or doped silicon. A second layer of insulator material 106 is fabricated on top of the first insulator layer. Using known pattern and etch techniques, a contact via 108, or opening, is formed to access conductor area 104. A contact via 110 is also formed to access base layer 100. The vias may be tapered and are intended to provide access to any region or material which is desired to be coupled to a conductor interconnect.

Conductor interconnect trenches 112 are patterned and etched into the dielectric layer 106. As stated above, the depth to width ration (aspect ratio) of the trenches and vias are typically high. This high aspect ratio created difficulty in properly filling the features with a metal alloy. The composition of the alloys of the present invention is described below, following a description of the remaining steps in the dual damascene process.

After the trenches and access vias are formed, a layer of metal 114 (and necessary barrier metallurgy) is deposited on the device. A physical vapor deposition technique, known to those skilled in the art, is used to fill the features and provide a layer of metal on top of layer 106. A CMP process is implemented to remove excess metal from the top surface of the structure and provide defined interconnect lines 116. As stated above, high temperatures must be combined with high pressure to achieve conditions where sufficient metal flow will take place to fill the narrow troughs 112 and vias 110 in the damascene process when standard Al-0.5% Cu alloy is used. The present invention provides an alloy, alloy system, and method which will enable force fill to be achieved at lower temperatures and/or pressures than can be obtained with the standard Al-0.5% Cu alloy which is used by much of the industry.

To achieve low flow resistance, in the aluminum alloys, it is desirable to operate as near the melting point of the alloy as possible. This can be achieved by either raising the temperature at which the fill takes place or lowering the melting point of the alloy used. Raising the temperature is undesirable because of processing concerns, as well as possible device and structural problems. Developing a lower melting point alloy specifically tailored to integrated circuit use is preferred. The alloy must have a low melting point and must also posses other critical parameters, namely high conductivity and good electromigration resistance. In order to achieve a relatively high conductivity, the elements used to lower the melting point must not have a high solubility in Aluminum at the integrated circuit operating temperature. At least one of the elements used must enhance the electromigration resistance of Aluminum. The elements Cu, Si, Ge and Mg all can lower the melting point of Aluminum, when added in sufficient quantities, and all have rather low solubilities in Aluminum at temperatures below 225° C., as shown in the Table 1.

TABLE 1

| Element added | Max. Solubility* | Solubility at 225° 0.C* | Solubility at 300° C.* | Solubility at 400° C.* | Eutectic Temp. ° C. |
| --- | --- | --- | --- | --- | --- |
| Cu | 5.65% | 0.06% | 0.19% | 0.64% | 548 |
| Si | 1.65% | 0.05% | 0.1% | 0.28% | 575 |
| Ge | 6.0% | 0.2% | 0.5% | 1.8% | 424 |
| Mg | 14.9% | 4.0% | 6.9% | 12.6% | 450 |
| 2MgSi | | | | 0.55% | 595 |

*percentages given in wt. %

The approximate effect of 1% alloying addition on resistivity in $\mu\Omega$'cm/wt percent alloying element is illustrated in Table 2.

TABLE 2

| Element | In Solid Solution | Not in Solution |
| --- | --- | --- |
| Cu | 0.344 | 0.03 |
| Si | 1.02 | 0.088 |
| Ge | | |
| Mg | 0.54 | 0.22 |

Copper is a well known electromigration enhancing alloying element. Thus, the present invention preferably includes at least 0.5 percent Cu. Further, the preferred alloy composition is an Al-Cu-Si alloy with a silicon concentration of 1 to 1.5 wt percent and a copper concentration of 4.5 to 5.5 wt percent. Useful alloys can be constructed, however, with Ge or Mg substituted for some of the silicon and some what lower copper concentrations. Assuming a composition of 5 wt percent copper and 1.25 wt percent silicon, and deposition and force fill temperatures of 300° C., the alloy restivity would be approximately 3.06 $\mu\Omega$'cm compared to a value of 2.65 $\mu\Omega$'cm for high purity aluminum at 20° C. This is approximately 16 percent higher than high purity aluminum, but only 8 percent higher than a 0.5 percent copper alloy which is currently processed at 400° C.

Current integrated circuit alloys are based on aluminum because of the simplicity of deposition and the low resistance between Al and Si. While it is preferred to use pure aluminum for increased conductivity, some Si and Cu are necessary to alleviate junction spiking and electromigration, respectively. Prior techniques teach that these alloy dopants must be minimized to maintain a high conductivity. Further, current interconnect processes are based on subtractive etch. That is, the metal layer is patterned and etched to remove unwanted metal. The addition of alloy dopants is minimized to improve etching. That is, Cu and Si increase the difficulty of etching because they do not form volatile fluorides. Thus, yield is decreased as the amount of dopants are increased. In contrast, the present invention deviates from the teaching in the art to sacrifice some conductivity to reduce the alloy melting temperature to allow for improved coverage of high aspect ratio features with a reduced pressure.

The present invention provides an alloy system for use in the fabrication of integrated circuits. The alloys of the present invention allow for reduced process temperature and pressures in filling high aspect ratio features using a dual damascene process. The aluminum interconnect alloy, in one embodiment, has 3 to 6 wt percent copper and 0.25 to 1.5 wt percent silicon. Up to 1 wt percent Ge and up to 2 wt percent Mg can also be added. The composition of Si+Ge+Mg is selected give a melting temperature (solidus) of the alloy which is between 500 and 550° C. In another embodiment, the aluminum alloy has 4.5 to 5.5 wt percent copper and 1 to 1.5 wt percent silicon. In a third embodiment, the aluminum alloy has 4.9 wt percent copper and 1.1 wt percent silicon. Again, up to 1 wt percent Ge and up to 2 wt percent Mg can be added to these alloys.

MEMORY DEVICE

Figure 2:
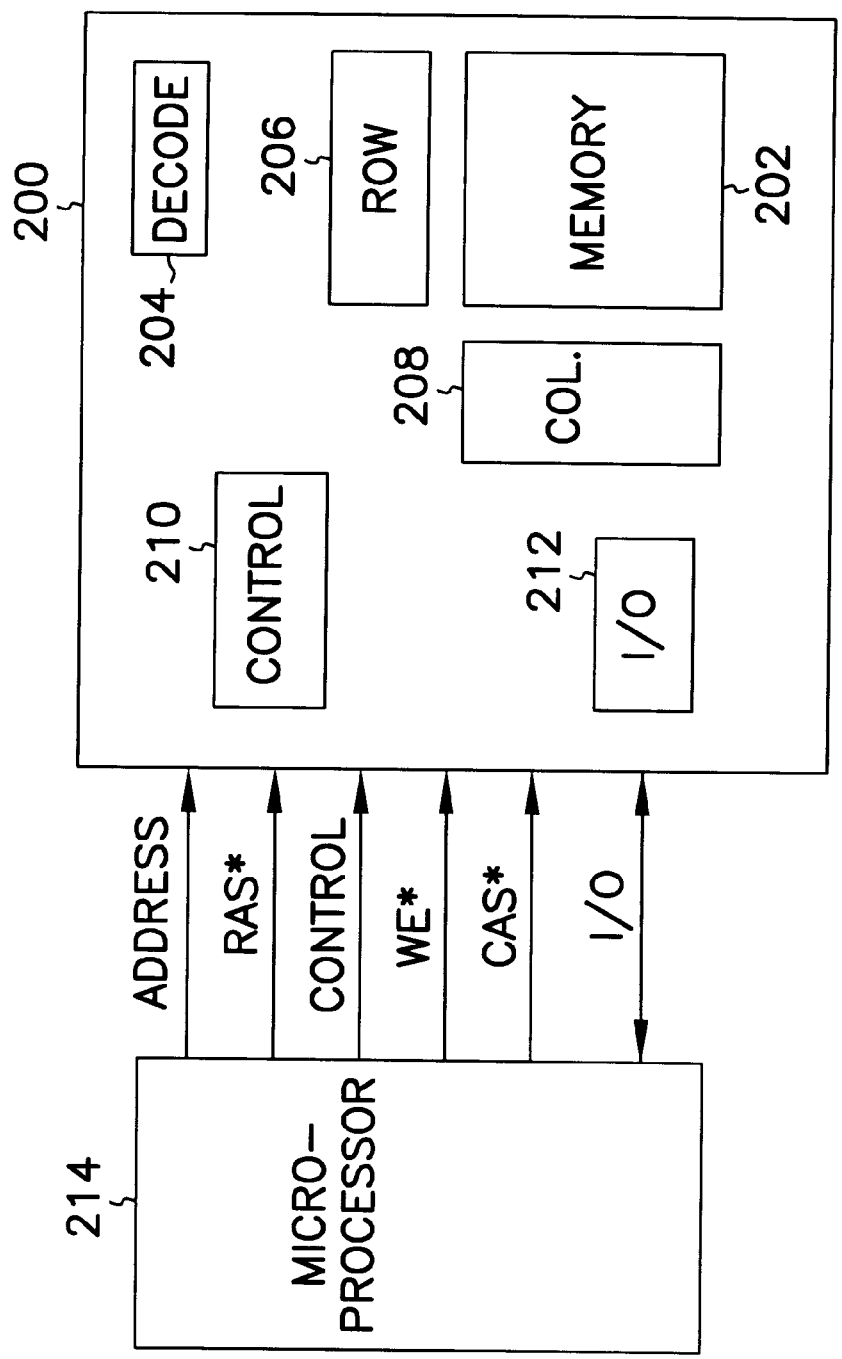
FIG. 2 is a block diagram of an integrated circuit memory device.

FIG. 2 is a simplified block diagram of a memory device according to one embodiment of the present invention. The memory device 200 includes an array of memory cells 202, address decoder 204, row access circuitry 206, column access circuitry 208, control circuitry 210, and Input/Output circuit 212. The memory can be coupled to an external microprocessor 214, or memory controller for memory accessing. The memory receives control signals from the processor 214, such as WE*, RAS* and CAS* signals. The memory is used to store data which is accessed via I/O lines. It will be appreciated by those skilled in the art that additional circuitry and control signals can be provided, and that the memory device of FIG. 10 has been simplified to help focus on the present invention. Thus, the memory includes internal circuitry and metal contacts and interconnects which are coupled to the memory array and internal circuitry. The metal contacts and interconnects are formed with an alloy consisting of aluminum, 3 to 6 wt percent copper, 0.25 to 1.5 wt percent silicon, up to 1 wt percent Ge, and up to 2 wt percent Mg. The composition of Si+Ge+Mg provides a melting temperature (solidus) of the aluminum interconnect alloy which is between 500 and 550° C. In another memory embodiment, the metal contacts and interconnects are formed with an alloy consisting of aluminum, 4.5 to 5.5 wt percent copper, 1 to 1.5 wt percent silicon, up to 1 wt percent Ge, and up to 2 wt percent Mg.

It will be understood that the above description of a DRAM is intended to provide a general understanding of the memory and is not a complete description of all the elements and features of a DRAM. Further, the present invention is equally applicable to any size and type of memory circuit and is not intended to be limited to the DRAM described above. Other alternative types of devices include SRAM or Flash memories. Additionally, the DRAM could be a synchronous DRAM commonly referred to as SGRAM, SDRAM, SDRAM II, and DDR SDRAM, as well as Synchlink or Rambus DRAMs.

Conclusion

An integrated circuit alloy has been described which deviates from the teaching in the art to sacrifice some conductivity of the alloy to reduce the alloy melting temperature. This reduction in melting temperature allows for improved coverage of high aspect ratio features with a reduced deposition pressure. The alloy is used to fabricate metal contacts and interconnects in integrated circuits, such as memory devices. The contacts and interconnects can be high aspect ratio features formed using a dual damascene process.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An integrated circuit memory device comprising:
    an array of memory cells;
    internal circuitry; and
    metal contacts and interconnects coupled to the memory array and internal circuitry, the metal contacts and interconnects comprises an aluminum interconnect alloy consists of aluminum, 4.5 to 5.5 wt percent copper, 1 to 1.5 wt percent silicon, a non-zero amount of Ge up to 1 wt percent Ge, and a non-zero amount of Mg up to 2 wt percent Mg, the composition of Si+Ge+Mg provides a melting temperature (solidus) of the aluminum interconnect alloy which is between 500 and 550° C.

2. The integrated circuit memory device of claim 1 wherein the metal contacts and interconnects were fabricated using a dual damascene process.

3. The integrated circuit memory device of claim 1 wherein the copper of the metal alloy is 4.9 wt percent copper, and the silicon is 1.1 wt percent silicon.

4. The integrated circuit memory device of claim 1 wherein the copper is 4.9 wt percent copper.

5. The integrated circuit memory device of claim 1 wherein the silicon is 1.1 wt percent silicon.

6. An integrated circuit device comprising:
    internal circuitry; and
    metal contacts and interconnects coupled to the internal circuitry, the metal contacts and interconnects comprise an aluminum interconnect alloy comprising aluminum, 4.5 to 5.5 wt percent copper, 1 to 1.5 wt percent silicon, a non-zero amount of Ge up to 1 wt percent Ge, and a non-zero amount of Mg up to 2 wt percent Mg, the composition of Si+Ge+Mg provides a melting temperature (solidus) of the aluminum interconnect alloy which is between 500 and 550° C.

7. The integrated circuit device of claim 6 wherein the metal contacts and interconnects are fabricated using a dual damascene process.

8. The integrated circuit device of claim 6 wherein the copper of the metal alloy is 4.9 wt percent copper, and the silicon is 1.1 wt percent silicon.

9. An integrated circuit device comprising:
    internal circuitry; and
    metal contacts and interconnects coupled to the internal circuitry, the metal contacts and interconnects comprise an aluminum interconnect alloy comprising aluminum, 4.9 wt percent copper, 1.1 wt percent silicon, a non-zero amount of Ge up to 1 wt percent Ge, and a non-zero amount of Mg up to 2 wt percent Mg, the composition of Si+Ge+Mg provides a melting temperature (solidus) of the aluminum interconnect alloy which is between 500 and 550° C.

10. An integrated circuit device comprising:

internal circuitry; and metal contacts and interconnects coupled to the internal circuitry, the metal contacts and interconnects comprise an aluminum interconnect alloy comprising aluminum, 4.5 to 5.5 wt percent copper, 1 to 1.5 wt percent silicon, a non-zero amount of Ge up to 1 wt percent Ge, and a non-zero amount of Mg up to 2 wt percent Mg.

* * * * *